United States Patent [19]

Choi et al.

[11] Patent Number: 5,325,258
[45] Date of Patent: Jun. 28, 1994

[54] POWER TRANSISTOR DRIVER CIRCUIT WITH CURRENT SENSING AND CURRENT OVERPROTECTION AND METHOD FOR PROTECTING POWER TRANSISTOR FROM OVERCURRENT

[75] Inventors: Chris Choi; David Tam, both of Redondo Beach, Calif.

[73] Assignee: International Rectifier Corporation, El Segundo, Calif.

[21] Appl. No.: 936,028

[22] Filed: Aug. 26, 1992

[51] Int. Cl.$^5$ .................. H02H 3/26; G05F 1/573
[52] U.S. Cl. .................. 361/87; 361/93; 323/276; 323/277; 363/56; 307/571
[58] Field of Search .................. 361/87, 93, 98, 100, 361/101, 103; 307/296.5, 571–573, 584; 323/276, 279, 284, 282, 351, 277; 363/55, 56

[56] References Cited

U.S. PATENT DOCUMENTS

| | | | |
|---|---|---|---|
| 4,771,357 | 9/1988 | Lorincz et al. | 361/87 |
| 4,896,245 | 1/1990 | Qualich | 361/103 |
| 4,937,697 | 6/1990 | Edwards et al. | 361/18 |
| 4,992,683 | 2/1991 | Robin, Jr. | 307/570 |
| 5,032,774 | 7/1991 | Juzswik | 318/293 |
| 5,192,906 | 3/1993 | Nathan | 323/284 |

Primary Examiner—Steven L. Stephan
Assistant Examiner—Adolf Berhane
Attorney, Agent, or Firm—Ostrolenk, Faber, Gerb & Soffen

[57] ABSTRACT

A circuit and method for driving a power transistor device. The circuit for driving a power transistor device has a driver having an input and an output, the output coupled to a control input of the power transistor device and the input coupled to a primary control voltage source for driving the power transistor device. A current sensing device is coupled to the power transistor device for providing a signal proportional to the current in the power transistor device. An amplifier is coupled to the current sensing device for providing a substantially linear control signal proportional to the current in the power transistor device, the linear control signal being provided to the input of the driver as a secondary drive signal for driving the power transistor device when a current level in the power transistor device greater than a threshold level is detected. A detector is provided for detecting when the current in the power transistor device is greater than the threshold level. The detector is coupled to the current sensing device and to a reference level source, and provides an overcurrent signal to the driver for switching the driver from being driven by the primary control voltage source to the secondary drive signal. The secondary drive signal drives the driver so as to reduce the current level in the power transistor device. The driven power transistor device is preferably a power MOSFET or IGBT.

38 Claims, 5 Drawing Sheets

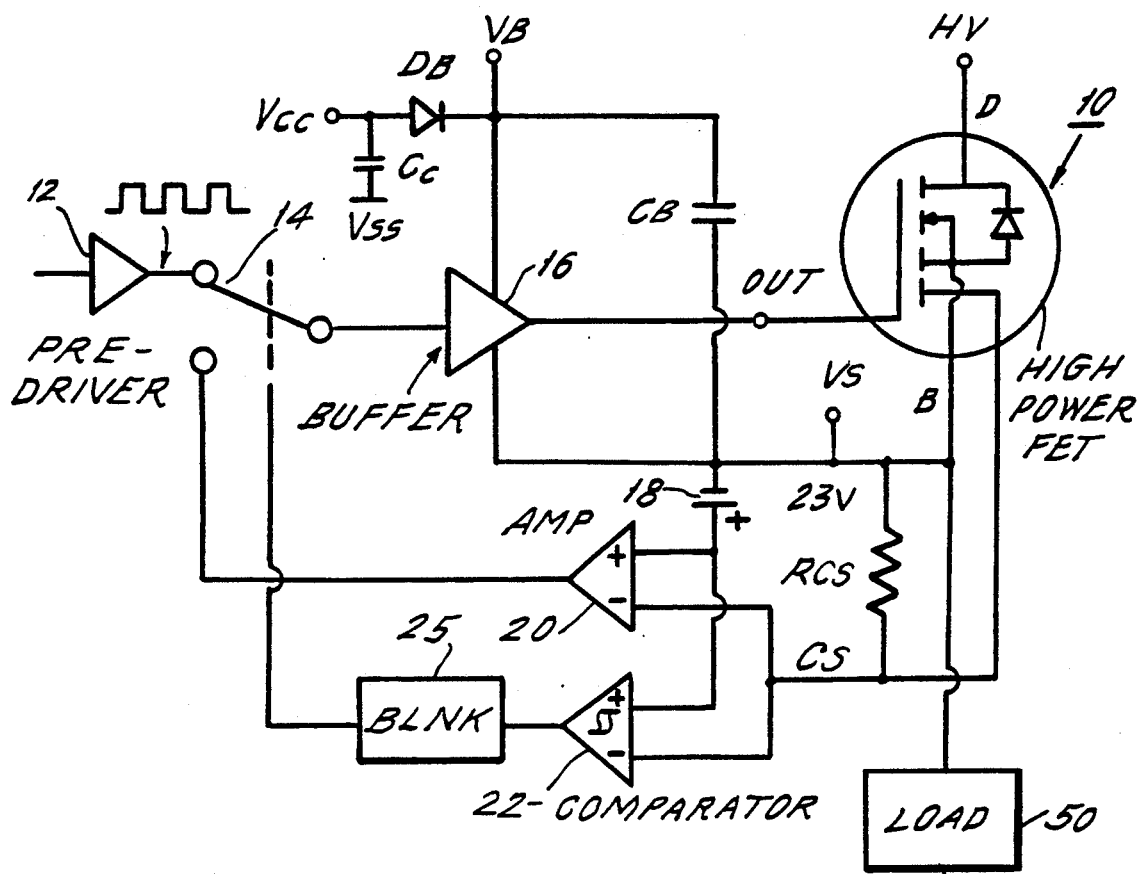
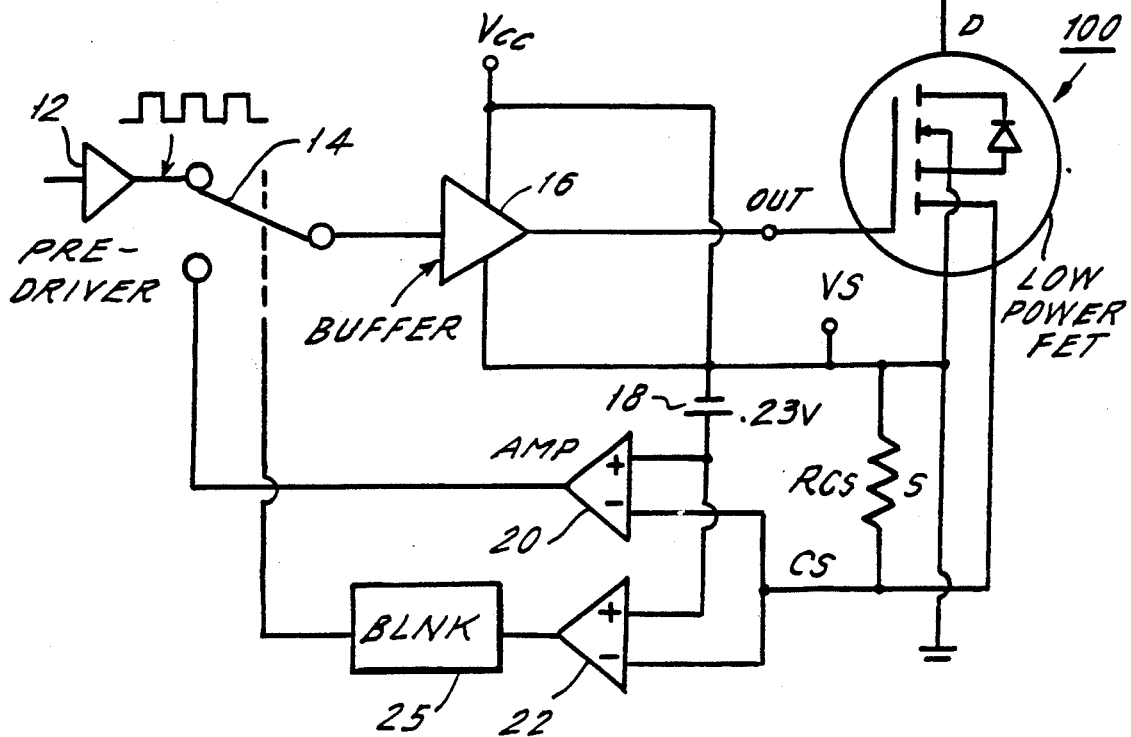
FIG. 1

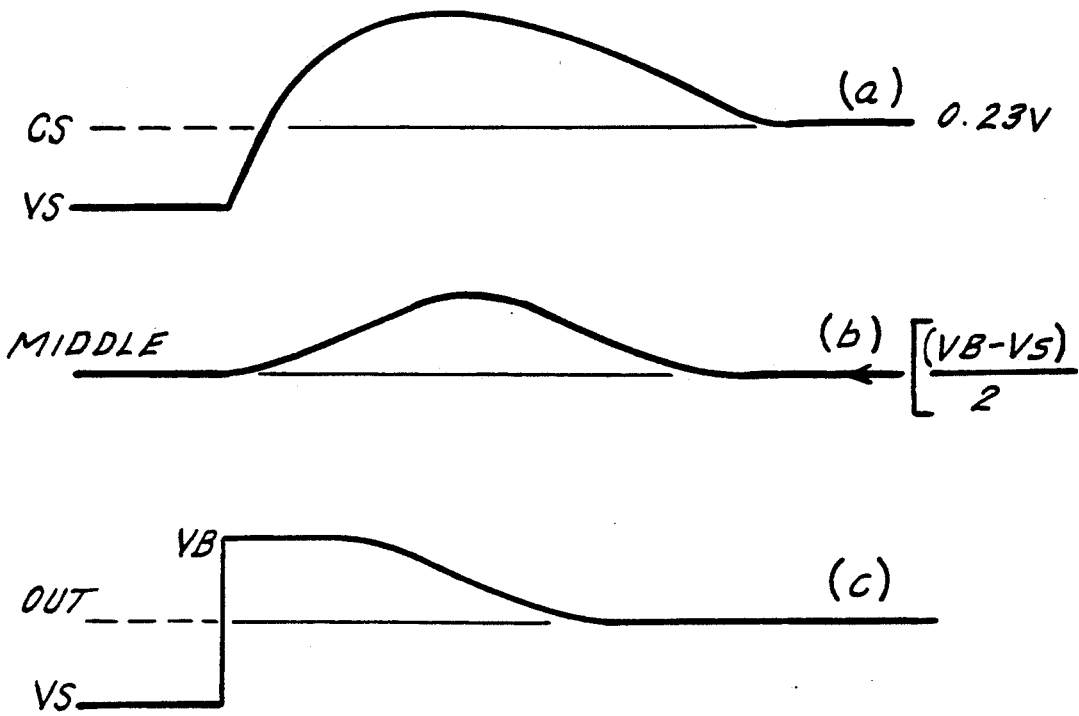
FIG. 5A WITHOUT PULLUP LOGIC:
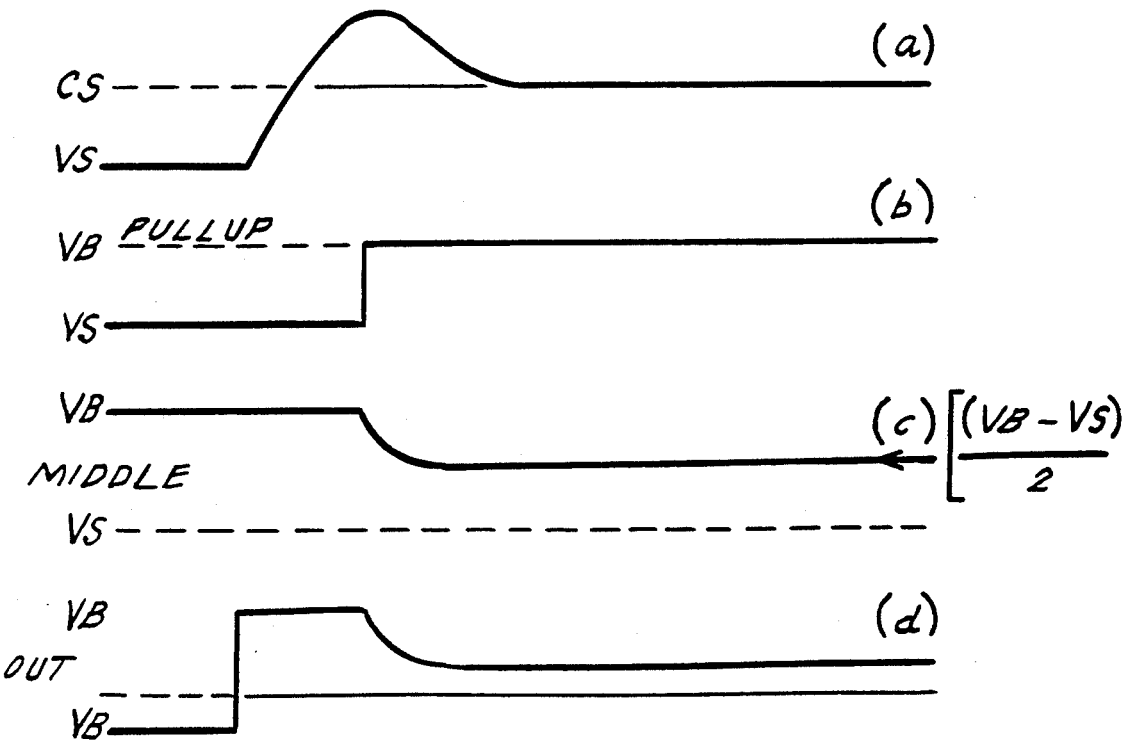
FIG. 5B WITH PULLUP LOGIC:

POWER TRANSISTOR DRIVER CIRCUIT WITH CURRENT SENSING AND CURRENT OVERPROTECTION AND METHOD FOR PROTECTING POWER TRANSISTOR FROM OVERCURRENT

BACKGROUND OF THE INVENTION

The present invention relates to driver circuits for power transistors and, more particularly, to a gate driver circuit employing current sensing, current limiting and current overprotection. The invention further relates to methods for power transistor protection in the event of an overcurrent. The present invention is particularly applicable to MOSFET and IGBT (insulated gate bipolar transistor) power transistors.

The provision of practical and economical current sensing circuitry in MOSFET and IGBT driver circuits for automatically protecting the power transistors from excessive overcurrents has long been sought by driver circuitry circuit designers and, in particular, in the high side of high side—low side MOSFET and IGBT power circuits.

SUMMARY OF THE INVENTION

It is an object of the present invention to provide a power transistor driver circuit, and in particular, such a driver circuit for driving the control gate of MOSFET and IGBT power transistors.

It is furthermore an object of the present invention to provide a current sensing and current overprotection circuit for MOSFET and IGBT power transistors.

It is a further object of the present invention to provide such a current sensing and current overprotection circuit, especially for the high side of a high side—low side power transistor switching arrangement.

The above and other objects are achieved by a circuit for driving a power transistor device comprising: a driver means having an input and an output, the output coupled to a control input of the power transistor device and the input coupled to a primary control voltage source for driving the power transistor device; current sensing means coupled to the power transistor device for providing a signal proportional to the current in power transistor device; amplifier means coupled to the current sensing means for providing a control signal proportional to the current in the power transistor device, the control signal being provided to the input of the driver means as a secondary drive signal for driving the power transistor device when a current level in the power transistor device greater than a threshold level is detected; and means for detecting when the current in the power transistor device is greater than the threshold level, the means for detecting being coupled to the current sensing means and to a reference level source, and providing an overcurrent signal to the driver means for switching the driver means from being driven by the primary control voltage source to the secondary drive signal, the secondary drive signal driving the driver means so as to reduce the current level in the power transistor device.

The above and other objects are achieved in accordance with another aspect of the invention by a circuit for driving a power transistor device comprising switching means having two inputs and an output, one input being coupled to a primary control voltage source for driving the power transistor device in a first state of the switching means, the switching means having a second state for supplying a secondary drive signal to the power transistor device; a driver means having an input and an output, the output of the driver means coupled to a control input of the power transistor device and the input of the driver means coupled to the output of the switching means for receiving the primary control voltage source in the first state and the secondary drive signal in the second state; current sensing means coupled to the power transistor device for providing a signal proportional to the current in the power transistor device; amplifier means coupled to the current sensing means for providing a control signal proportional to the current in the power transistor device, the control signal being provided to the second input of the switching means as the secondary drive signal for driving the power transistor device when a current level in the power transistor device greater than a threshold level is detected; and means for detecting when the current in the power transistor device is greater than the threshold level, the means for detecting being coupled to the current sensing means and to a reference level source, and providing an overcurrent signal to the switching means for switching the driver means from being driven by the primary control voltage source to the secondary drive signal, the secondary drive signal driving the driver means so as to reduce the current level in the power transistor device.

The above and other objects are also achieved by a method for driving a power transistor device comprising driving a control input of the power transistor device with a primary control voltage source, sensing the current in the power transistor device and providing a signal proportional to the current in the power transistor device, providing a control signal proportional to the current in the power transistor device, the step providing a control signal comprising supplying a secondary drive signal for driving the power transistor device when a current level in the power transistor device greater than a threshold level is detected, detecting when the current in the power transistor device is greater than the threshold level, and providing an overcurrent signal for switching a driver means driving the power transistor from being driven by the primary control voltage source to the secondary drive signal, the secondary drive signal driving the driver means so as to reduce the current level in the power transistor device.

Other features and advantages of the present invention will become apparent from the following description of the invention which refers to the accompanying drawings.

BRIEF DESCRIPTION OF THE DRAWINGS

The invention will be described in greater detail in the following detailed description with reference to the drawings in which:

FIG. 1 shows an overall block/schematic diagram of a portion of the gate drive circuitry for two power MOSFET transistors arranged in a high side—low side configuration;

FIG. 5A(a-c) and FIG. 5B (a-d), respectively, show waveforms in the circuit of FIG. 4 with and without the pull-up logic circuitry shown in FIG. 4.

DETAILED DESCRIPTION OF THE DRAWINGS

Figure 2:
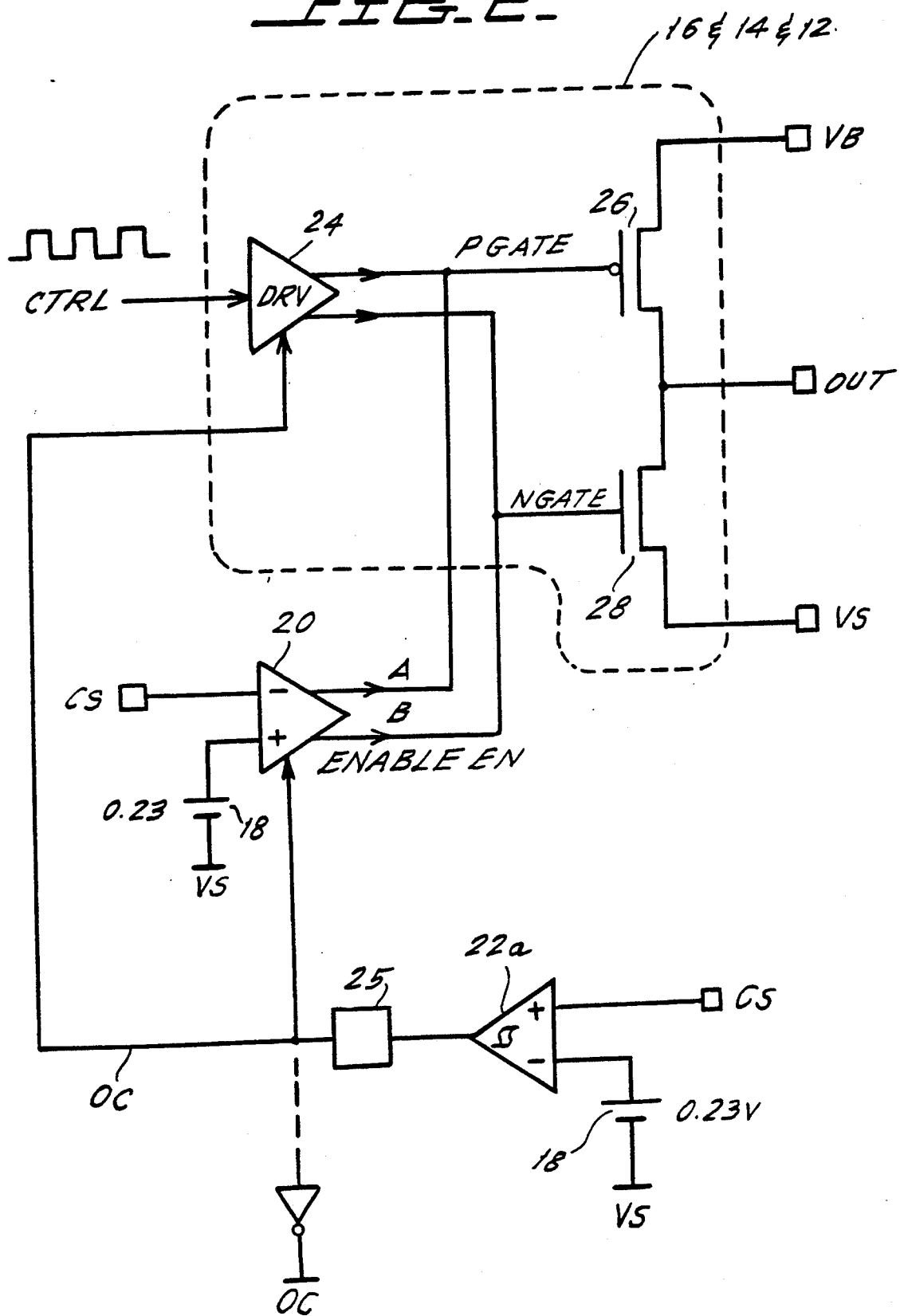
FIG. 2 shows further details of portions of the circuitry of FIG. 1.

With reference now to the drawings, FIG. 1 shows the overall block/schematic diagram of a portion of a gate driver circuit for a high side—low side power transistor configuration. In FIG. 1, a high side power MOSFET is shown at 10 and a low side power MOSFET is shown at 100. These power MOSFETs are of the type provided with extra cells utilized for current sensing, and sold by the assignee of the present invention as its HEXSENSE MOSFET power transistors. However, the invention is also applicable to standard FETs or MOSFETs or any MOS gated switch output devices, for example, IGBTs and HEXFET MOSFETs sold by the assignee of the present invention.

With reference to FIG. 1, the gate driver circuits shown in the high side and low side are substantially identical, and like reference numerals will be employed with reference to each. Unless otherwise noted, the description with respect to one applies equally to the other side.

Suitable control signals, for example, pulse width modulated signals, are provided from a pre-driver circuit 12. The output from the pre-driver circuit 12 is coupled to a switching circuit, illustratively shown at 14. The switching circuit is coupled to a buffer stage 16. The switching circuit 14 and buffer stage 16, although illustratively shown as two separate components in FIG. 1 for purposes of explanation, may be implemented through appropriate enabling circuitry and driver stages, as will be explained in greater detail with reference to FIG. 2.

The output of buffer stage ! 6, labelled OUT in FIG. 1, is provided to the gate of the power transistor 10,100, illustratively, power HEXSENSE FETs. The drain of the FET 10 is provided to the high voltage side of the supply HV, (for example 500 Vl) and the source is coupled through a load 50 to the drain of the low side power FET 100. The source of the low side power FET 100 is coupled to a suitable return leg of the supply, here shown as ground.

At least one of the cells of the FET 10,100 is coupled through a sensing resistor RCS to the source of the power FET. The source of each FET is also coupled to a floating supply offset voltage VS. The voltage VS, as well as a floating offset voltage VB higher than VS is provided to the buffer stage 16.

A voltage source, for example, a regulated constant voltage source 18, is provided, coupled between VS and one terminal of an operational amplifier 20. The positive terminal of the voltage source 18 is also shown coupled to a terminal of a comparator 22. The other terminals of the operational amplifier 20 and the comparator 22, illustratively shown as the negative terminal, are connected together to a terminal CS. The sensing resistor RCS is connected across the terminals VS and CS. The output of operational amplifier 20 is provided to one pole of switching circuit 14 and the output of comparator 22 is provided through a blanking stage 25 to control the switching stage 14.

A bootstrap capacitor CB is connected across the VB and VS floating supply voltages.

The floating supply voltages VB and VS are derived from the fixed voltage supply Vcc, using a bootstrap technique. The bootstrap technique includes charging diode DB and bootstrap capacitor CB. The charging diode DB must have a voltage withstand capability higher than the peak HV bus voltage. To prevent the bootstrap capacitor CB from discharging, a fast recovery diode DB is recommended. The value of the bootstrap capacitor CB depends on the switching frequency, duty cycle and gate charge requirement of the power device 10. The voltage across the capacitor should not be allowed to drop below the undervoltage lockout threshold. A 0.1 uf capacitor is usually suitable for applications switching above 5 kHz.

A supply bypass capacitor Cc between Vcc and Vss is also required to supply the transient current needed for refreshing the bootstrap supply. Typically, a value of ten times the bootstrap capacitor CB is provided.

Figure 3:
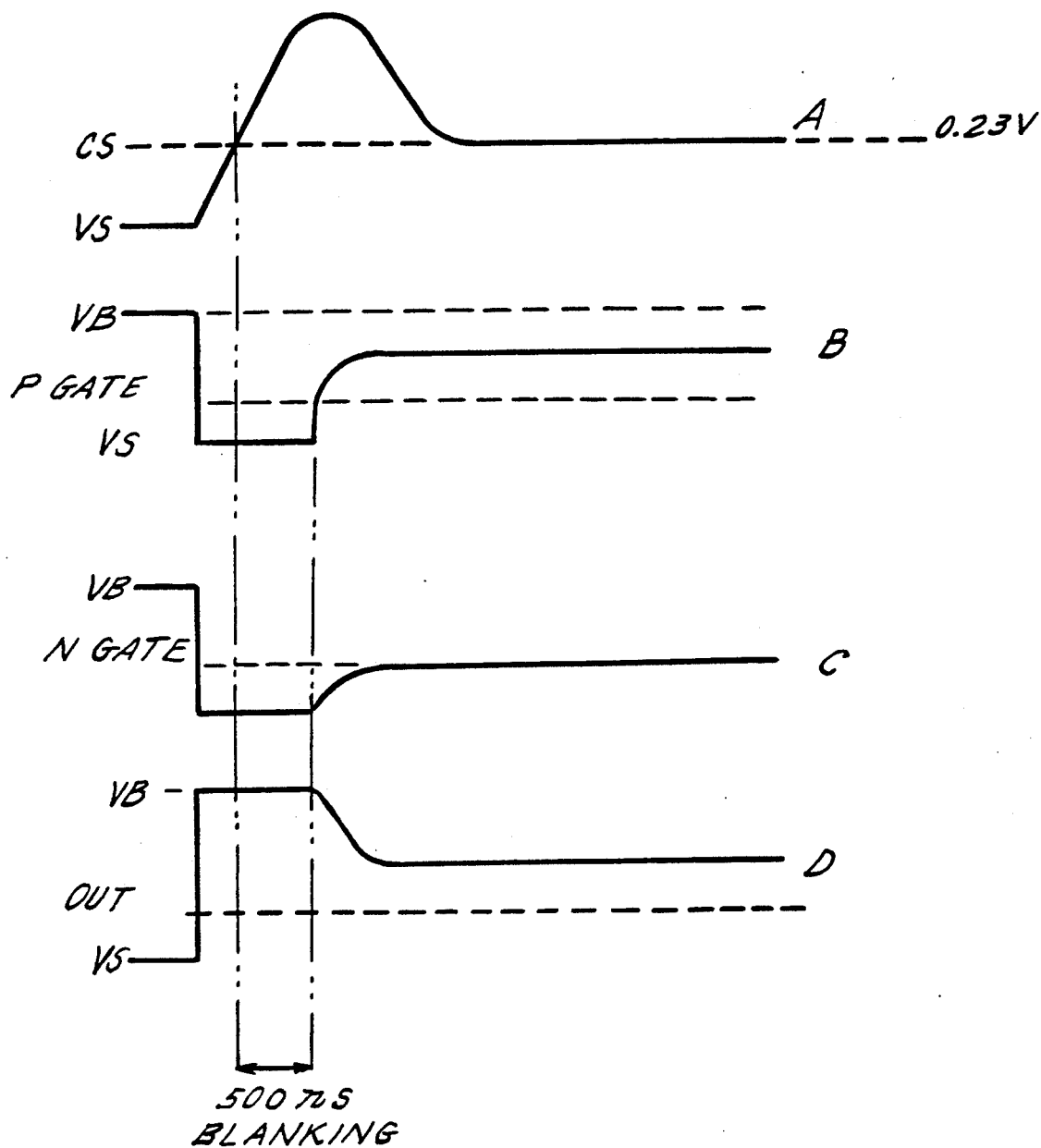
FIG. 3 shows waveforms in the circuit of FIG. 2.

FIG. 2 shows a portion of the circuit of FIG. 1 in greater detail. FIG. 3 shows waveforms in the circuit of FIG. 2. In the illustrated embodiment shown in FIG. 2, the voltage source 18 is approximately 230 mV. The terminal CS in FIG. 2 has been shown as being coupled to the positive terminal of comparator 22a with the positive terminal of the voltage source 18 being coupled to the negative terminal. This is equivalent to the connection shown in FIG. 1, where the voltage source and terminal CS have been reversed, if one considers the output of the comparator to be the complement of the output of the comparator shown in FIG. 1, i.e., a high output from comparator 22a of FIG. 2 is a low output from comparator 22 in FIG. 1 and vice versa.

As shown in FIG. 2, buffer stage 16 comprises a driver stage 24 having complementary outputs PGATE and NGATE which are coupled to complementary. MOSFET driver transistors 26 and 28. The MOSFET driver transistors 26 and 28 are connected in series, as shown, between the terminals VB and VS, with the common junction connected to terminal OUT. The terminal OUT drives the gate of the power FET 10 or 100. The driver 24 operates in order to avoid cross-conduction noise spikes, such that the pull-up transistor 26 is turned off before the pull-down transistor 28 turns on, and vice versa. The output of comparator 22a provides an enable signal to operational amplifier 20 and a disable signal to driver 24 through a blanking circuit 25, to be described in more detail below.

Operational amplifier 20 shown in FIG. 2, also has complementary outputs A and B, coupled to PGATE and NGATE, respectively.

The circuit operates as follows. Should the current through the power FET 10 or 100 increase to a level such that the voltage across RCS becomes greater than 230 Mv, comparator 22a will provide a positive output. The positive output (at level VB) is provided to the enable input of the operational amplifier 20 and the disable input of the driver 24. The driver 24 is, as a result, disabled and, in effect, the primary control signal at its input is disconnected from the driver FETs 26 and 28. In this way, the current in the power transistors 10 or 100 is limited from increasing to levels which would destroy the transistors.

In order to prevent spurious signals, for example, spikes from the normal switching of the output transistors 10 and 100 or other transients from being coupled through and activating the disable input of the driver stage 24, the blanking stage 25 is provided to prevent the disable signal from comparator 22 from being gated to the disable input of driver stage 24 until a specific time after the transition occurs has elapsed and the condition still exists. Accordingly, signals having a duration less than the blanking time will not deactivate driver stage 24. In a preferred embodiment, the blanking time that has been found to be practical is approximately 500 ns.

Instead of simply disabling the driver stage 24 and therefore disconnecting the gates of the driver transistors 26 and 28, the output transistors 10 and 100 are placed in a linear mode through these driver transistors by operational amplifier 20.

The operational amplifier 20 has its input terminals connected to the current sense terminal CS and also the voltage source 18. Should the voltage across resistor RCS become greater than 230 Mv, indicating an overcurrent, driver 24 is disabled by comparator 22a, and the A and B outputs of operational amplifier 20 are driven such that transistors 26 and 28 operate in a linear mode, whereby the feedback operational amplifier 20 controls the output voltage at terminal OUT. The amplifier 20 and the driven power device 10 or 100 together form a negative feedback loop to settle the gate drive voltage OUT to a lower value such that the power device 10 or 100 current is limited to a preset value determined by the sensing resistor RCS.

This is shown more specifically in FIG. 3, where the voltage across resistor RCS is shown as increasing above the 0.23 V level in FIG. 3A. As a result, after the blanking delay of approximately 500 ns provided by blanking stage 25, the voltage PGATE shifts from a level VS, provided by the output of driver 24 under such circumstances, to a value between VB and VS set by amplifier 20, as determined by the feedback maintaining a voltage of 230 mV across resistor RCS. Similarly, the signal NGATE shifts from a level VS to a level intermediate VB and VS, as shown in FIG. 3C. The output voltage, as shown in FIG. 3D, shifts to a level between VB and VS, as determined by the 230 mV level maintained across resistor RCS by the operation of feedback through the operational amplifier 20.

Figure 4:
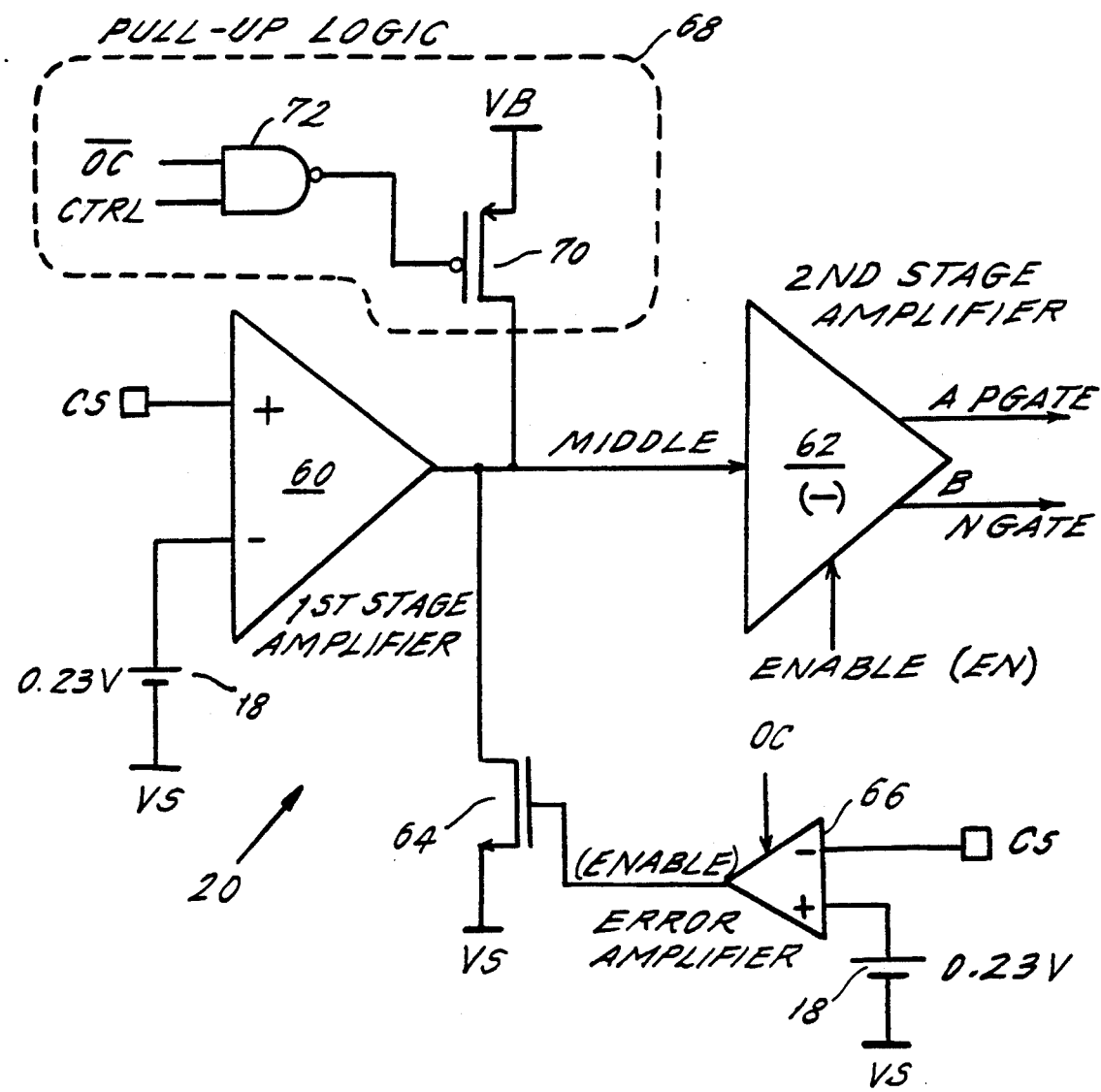
FIG. 4 shows further details of the circuit of FIG. 1.

FIG. 4 shows the structure of the operational amplifier 20 in greater detail, as well as additional pull-up logic circuitry which has been provided to speed the operation of the switching from the normal drive mode to the linear mode when an overcurrent has been detected.

The operational amplifier 20 comprises a first stage amplifier 60 and a second stage amplifier 62. The first stage amplifier 60 is coupled to the CS terminal and to the voltage source 18. Because the second stage amplifier 62 is an inverting amplifier, the first stage amplifier positive terminal is connected to the terminal CS and the negative terminal is connected to the voltage source 18. The combination of the two stages 60 and 62 results in the operational amplifier 20, as shown in FIG. 1 with the positive and negative terminals connected as shown in FIG. 1. The output of the operational amplifier 60 is connected to the inverting amplifier 62, having two outputs A and B, corresponding respectively to PGATE and NGATE, as described previously with reference to FIG. 2.

The output of first stage amplifier 60 is also coupled to an NMOSFET 64, having its gate coupled to the output of an error amplifier 66. The input terminals of the error amplifier 66 are connected as shown to the CS terminal and the voltage source 18. Error amplifier 66 also has an enable input coupled to overcurrent signal OC.

The enable input EN of the operational amplifier 20 of FIG. 2 is supplied to the second stage inverting amplifier 62 and is coupled, as shown in FIG. 2, to the output of comparator 22a.

Pull-up logic circuitry 68 preferably is provided, comprising a P channel MOSFET 70 whose gate is coupled to logic circuitry, here shown as a NAND gate 72. The inputs of the NAND gate 72 are coupled to an inverted version of the overcurrent signal OC, supplied at the output of the blanking stage 25, as shown in FIG. 2.

In the absence of the pull-up logic circuitry 68, the portion of the circuit shown in FIG. 4 operates as follows, with reference to FIG. 5A. As shown in FIGs. 4 and 5A, the output of first stage amplifier 60 has been designated as MIDDLE. Without the pull-up logic circuitry 68, when the CS terminal detects an overcurrent because the voltage across resistor RCS has exceeded 230 mV, it will take a relatively long time for the output voltage OUT, as shown in FIG. 5A(c), to reach its level intermediate VB and VS corresponding to the 230 mV level across resistor RCS. Due to the relatively high input impedance of the second stage amplifier 62, the signal MIDDLE, as shown in FIG. 5A(b), will reach its voltage of approximately $$\left[\frac{(VB-VS)}{2}\right]$$

after a long time delay, and therefore the signal OUT will likewise reach its level intermediate VB and VS after a relatively long time delay. When the voltage across the resistor RCS exceeds 230 mV, indicating an overcurrent, amplifier stage 60 will generate a more positive voltage at MIDDLE, as shown in FIG. 5A(b), and error amplifier 66 will generate a lower level signal (OC high and CS greater than 0.23 V), making N channel MOSFET 64 conduct less. The higher level MIDDLE signal is inverted by second stage amplifier 62, resulting in driving the signals PGATE and NGATE to the steady linear levels shown in FIGS. 3B and 3C as described with reference to FIG. 2.

In the absence of an overcurrent signal, first stage amplifier 60 output will be high and the output of error amplifier 66 will be low (because the error amplifier is disabled by OC being low), leaving N channel MOSFET 64 in an off state, bringing the signal MIDDLE to a level approaching VB. The second stage amplifier 62 in this condition will be disabled by the signal EN provided at the output of comparator 22a. This leaves the signals PGATE and NGATE free to be driven by the levels provided by the driver 24, as described with reference to FIG. 2.

In order to drive the signal MIDDLE more quickly to its level intermediate VB and VS when an overcurrent occurs, the pull-up logic circuitry 68 may be provided. NAND gate 72 is coupled to the control input signal CTRL, as well as the inverted form of the overcurrent signal OC supplied at the output of blanking stage 25. In the absence of an overcurrent, signal OC will be low, and therefore the NAND gate 72 will be enabled, allowing the control pulses, in inverted form, to be coupled through to the P channel MOSFET 70. The enable input of the second stage amplifier 62 will be at a low level, thereby disabling the signals PGATE and NGATE from being gated through to the driver transistors 26 and 28.

When an overcurrent occurs, signal OC is driven high, with the result that the NAND gate 72 is disabled. The high-level at the output of NAND gate 72 turns off the P channel MOSFET 70. In the absence of an overcurrent, the signal OC will drive the output of NAND gate 72 low (when the control signal is high), thereby turning on P channel MOSFET 70 and placing the signal MIDDLE at a level VB. Accordingly, prior to an overcurrent, the signal MIDDLE will be at VB and, when the overcurrent occurs and the P channel MOSFET turns OFF, the signal MIDDLE will rapidly change level from VB to a level intermediate VB and VS. See FIG. 5B(c). In contrast, without the pull-up logic circuitry, the signal MIDDLE slowly must rise to a level approaching VB before settling to its level intermediate VB and VS, as shown in FIG. 5A(b). Accordingly, since the signal MIDDLE reaches its intermediate level between VB and VS more quickly, because it need only fall from the level VB to the level intermediate VB and VS, the signal OUT provided to the power device 10 or 100 also reduces to a level intermediate VB and VS more quickly. See FIG. 5B(d) Since the circuit utilizes negative feedback, this is accomplished all the more quickly, as once the output voltage begins to reduce, the voltage across the resistor RCS rapidly reaches its level of approximately 230 mV, driving the signal OUT rapidly to its safe level intermediate VB and VS. This reduces the overcurrent more quickly as shown by the more rapid setting of CS t its level of 230 mV.

The purpose of error amplifier 66 is to quickly drive CS to 0.23 V when the overcurrent condition is ending. When CS returns to 0.23 V, as at the right side of FIG. 5A(a), when the overcurrent is ending, CS approaches 0.23 V. It may actually go below 0.23 V and undershoot, an undesirable condition. To minimize such undershoot, error amplifier 66 is provided. If CS goes below 0.23 V, error amplifier 66 responds by having its output go high, which turns NMOS 64 on, driving MIDDLE low, and OUT high, thus driving CS quickly back higher to 0.23 V. The error amplifier 66 only responds during an overcurrent condition, due to the enable input, which is coupled to the overcurrent signal OC. When OC is low, indicating no overcurrent, error amplifier 66 is disabled. It is only enabled, and thus capable of performing its function of clamping undershoot below CS=0.23 V when OC is high.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification is, accordingly, to be regarded in an illustrative rather than a restrictive sense.

We claim:

1. A circuit for driving a power transistor device comprising:

a driver means having an input and an output, the output coupled to a control input of the power transistor device and the input coupled to a primary control voltage source for driving the power transistor device;

current sensing means coupled to the power transistor device for providing a signal proportional to the current in said power transistor device;

amplifier means coupled to the current sensing means for providing a control signal proportional to the current in said power transistor device, said control signal being provided to the input of said driver means as a secondary drive signal for driving said power transistor device at a reduced current level in a linear region of operation of the power transistor device when a current level in said power transistor device greater than a threshold level is detected; and means for detecting when the current in said power transistor device is greater than said threshold level, said means for detecting being coupled to said current sensing means and to a reference level source, and providing an overcurrent signal to said driver means for switching said driver means from being driven by said primary control voltage source to said secondary drive signal, said secondary drive signal driving said driver means so as to reduce the current level in said power transistor device to said reduced level in the linear region of operation of the power transistor device.

2. The circuit recited in claim 1, wherein said means for detecting comprises comparator means, said current sensing means comprises a resistor coupled to said power transistor device so as to have a current therethrough proportional to the current in said power transistor device, and said reference source comprises a substantially constant voltage source.

3. The circuit recited in claim 2, wherein the output of said comparator means comprising said overcurrent signal is coupled to a control input of said driver means, said control input comprising means for disabling said driver means from being responsive to said primary control voltage source if there is an overcurrent condition and for enabling said driver means to be responsive to said secondary drive signal if there is an overcurrent condition.

4. The circuit recited in claim 3, wherein said driver means comprises a first driver stage having said control input and having an output coupled to a second driver stage, said overcurrent signal being coupled to the control input of said first driver stage, said amplifier means having an output whereby said control signal is provided on said output of said amplifier means to said second driver stage to drive said second driver stage when said overcurrent signal disables said first driver stage.

5. The circuit recited in claim 4, wherein said amplifier means has a control input, said control input coupled to the output of said comparator means, whereby said amplifier means is disabled when said comparator means does not detect an overcurrent condition in said power transistor device.

6. The circuit recited in claim 5, wherein said first driver stage comprises a driver amplifier having two outputs, and said second driver stage comprises two complementary transistors, one coupled to a more positive voltage level than the other, with a common point between the two transistors, the one coupled to a higher voltage level comprising a pull-up device and the other comprising a pull-down device for driving said power transistor device, the power transistor device having its control input coupled to the common point, the two transistors each having a control input coupled to respective ones of said first driver stage outputs.

7. The circuit recited in claim 5, further comprising a blanking stage coupled to the output of said comparator means for preventing the production of said overcurrent signal for a prescribed time, thereby preventing false production of said overcurrent signal in response to spurious signals at said power transistor device.

8. The circuit recited in claim 5, wherein said amplifier means comprises first and second amplifier stages, said first stage having first and second inputs, one of said inputs being coupled to said voltage reference source and the other of said inputs being coupled to said current sensing means, said first amplifier stage having an output coupled to an input of said second amplifier stage, said second amplifier stage having an output coupled to said input of said second driver stage.

9. The circuit recited in claim 8, wherein said second amplifier stage has said control input coupled to said output of said comparator means, for enabling said second amplifier stage to pass said secondary drive signal when said comparator means detects an overcurrent condition in said power transistor device and for disabling said second amplifier stage in the absence of an overcurrent condition in said power transistor device.

10. The circuit recited in claim 9, wherein said output of said first amplifier stage coupled to the input of said second amplifier stage is further coupled to an output of error amplifier means having one input connected to said current sensing means and another input coupled to said reference voltage source, said error amplifier means maintaining said input of said second amplifier stage at a substantially constant voltage during an overcurrent condition in said power transistor device.

11. The circuit recited in claim 10, further comprising logic means coupled to said input of said second amplifier stage for driving said input of said second amplifier stage toward a supply voltage level in the absence of an overcurrent condition in said power transistor device, thereby increasing the speed at which an overcurrent condition is reduced.

12. The circuit recited in claim 11, wherein said second amplifier stage comprises amplifier means having two outputs, and further wherein said second driver stage has a pull-up and a pull-down transistor connected in series, with said pull-up transistor connected to a supply voltage source and said pull-down transistor connected to a supply return, with a common point between said pull-up and pull-down transistor, said common point being coupled to the control input of said power transistor device, and further wherein said pull-up and pull-down transistors have control inputs coupled to respective ones of said two outputs of said second amplifier stage.

13. The circuit recited in claim 12, wherein said first driver stage comprises a driver amplifier having two outputs, the two outputs being coupled to respective ones of the control inputs of the two transistors of said second driver stage.

14. The circuit recited in claim 1, wherein said power transistor device comprises one of a FET, MOSFET, current sensing FET or IGBT.

15. The circuit recited in claim 1, further comprising two of said circuits coupled to respective power transistor devices, with the power transistor devices coupled in series with a load device.

16. A circuit for driving a power transistor device comprising:
switching means having first and second inputs and an output, the first input being coupled to a primary control voltage source for driving power transistor device in a first state of the switching means, the switching means having a second state for supplying a secondary drive signal to the power transistor device;
driver means having an input and an output, the output of the driver means coupled to a control input of the power transistor device and the input coupled to the output of the switching means for receiving the primary control voltage source in the first state and the secondary drive signal in the second state;
current sensing means coupled to the power transistor device for providing a signal proportional to the current in said power transistor device;
amplifier means coupled to the current sensing means for providing a control signal proportional to the current in said power transistor device, said control signal being provided to the second input of said switching means as said secondary drive signal for driving said power transistor device at a reduced level in a linear region of operation of the power transistor device when a current level in the power transistor device greater than a threshold level is detected; and
means for detecting when the current in said power transistor device is greater than said threshold level, said means for detecting being coupled to said current sensing means and to a reference level source, and providing an overcurrent signal to said switching means for switching said driver means from being driven by said primary control voltage source to said secondary drive signal, said secondary drive signal driving said driver means so as to reduce the current level in said power transistor device to said reduced level in the linear region of operation of the power transistor device.

17. The circuit recited in claim 16, wherein said means for detecting comprises comparator means, said current sensing means comprises a resistor coupled to said power transistor device so as to have a current therethrough proportional to the current in said power transistor device, and said reference source comprises a substantially constant voltage source.

18. The circuit recited in claim 17, wherein the output of said comparator means comprising said overcurrent signal is coupled to a control input of said driver means and further wherein said output of said comparator means is provided to a control input of said amplifier means, said control inputs of said driver means and said amplifier means comprising said switching means such that said driver means is disabled by said control input of said driver means from being responsive to said primary control voltage source if there is an overcurrent condition in said power transistor device and is enabled to be responsive to said secondary drive signal if there is an overcurrent condition, said amplifier means being enabled by said control input of said amplifier means if there is an overcurrent condition in said power transistor device thereby providing said secondary drive signal to the power transistor device, said amplifier means being disabled by said control input in the absence of an overcurrent condition.

19. The circuit recited in claim 18, wherein said driver means comprises a first driver stage having said control input and having an output coupled to a second driver stage, said overcurrent signal being coupled to the control input of said first driver stage, said amplifier means having an output whereby said control signal is provided on said output of said amplifier means to said second driver stage to drive said second driver stage when said overcurrent signal disables said first driver stage.

20. The circuit recited in claim 19, wherein said first driver stage comprises a driver amplifier having two outputs, and said second driver stage comprises two complementary transistors, one coupled to a more positive voltage level than the other, with a common point between the two transistors, the one coupled to a higher voltage level comprising a pull-up device and the other comprising a pull-down device for driving said power transistor device, the power transistor device having its control input coupled to the common point, the two transistors having a control input coupled to respective ones of said first driver stage outputs.

21. The circuit recited in claim 18, further comprising a blanking stage coupled to the output of said comparator means for delaying the production of said overcurrent signal for a prescribed time, thereby preventing false production of said overcurrent signal in response to spurious signals at said power transistor device.

22. The circuit recited in claim 19, wherein said amplifier means comprises first and second amplifier stages, said first amplifier stage having first and second inputs, one of said inputs being coupled to said voltage reference source and the other of said inputs being coupled to said current sensing means, said first amplifier stage having an output coupled to an input of said second amplifier stage, said second amplifier stage having an output coupled to said input of said second driver stage.

23. The circuit recited in claim 22, wherein said second amplifier stage has said control input coupled to said output of said comparator means, for enabling said second amplifier stage to pass said secondary drive signal when said comparator means detects an overcurrent condition in said power transistor device and for disabling said second amplifier stage in the absence of an overcurrent condition in said power transistor device.

24. The circuit recited in claim 23, wherein said output of said first amplifier stage coupled to the input of said second amplifier stage is further coupled to an output of error amplifier means having one input connected to said current sensing means and another input coupled to said reference voltage source, said error amplifier means maintaining said input of said second amplifier stage at a substantially constant voltage during an overcurrent condition in said power transistor device.

25. The circuit recited in claim 24, further comprising logic means coupled to said input of said second amplifier stage for driving said input of said second amplifier stage toward a supply voltage level in the absence of an overcurrent condition in said power transistor device, thereby increasing the speed at which said overcurrent condition is reduced.

26. The circuit recited in claim 25, wherein said second amplifier stage comprises amplifier means having two outputs, and further wherein said second driver stage has a pull-up and a pull-down transistor connected in series, with said pull-up transistor connected to a supply voltage source and said pull-down transistor connected to a supply return, with a common point between said pull-up and pull-down transistor, said common point being coupled to the control input of said power transistor device, and further wherein said pull-up and pull-down transistors have control inputs coupled to respective ones of said two outputs of said second amplifier stage.

27. The circuit recited in claim 26, wherein said first driver stage comprises a driver amplifier having two outputs, the outputs being coupled to respective ones of the control inputs of the two transistors of said second driver stage.

28. The circuit recited in claim 16, wherein said power transistor device comprises one of a FET, MOSFET, current sensing FET or IGBT.

29. The circuit recited in claim 16, further comprising two of said circuits coupled to respective power transistor devices, with the power transistor devices coupled in series with a load device.

30. A method for protecting a power transistor device from an overcurrent comprising:
driving a control input of the power transistor device with a primary control voltage source;
sensing the current in the power transistor device and providing a signal proportional to the current in said power transistor device;
providing a control signal proportional to the current in said power transistor device, said step of providing a control signal comprising supplying a secondary drive signal for driving said power transistor device at a reduced level in a linear region of operation of the power transistor device when a current level in said power transistor device greater than a threshold level is detected; and
detecting when the current in said power transistor device is greater than said threshold level, and providing an overcurrent signal for switching a driver means driving the power transistor from being driven by said primary control voltage source to said secondary drive signal, said secondary drive signal driving said driver means so as to reduce the current level in said power transistor device to said reduced level in the linear region of operation of the power transistor device.

31. The method recited in claim 30 further comprising disabling said driver means from being responsive to said primary control voltage source if there is an overcurrent condition and enabling said driver means to be responsive to said secondary drive signal if there is an overcurrent condition.

32. The recited in claim 31 further comprising disabling said second drive signal in the absence of an overcurrent condition in said power transistor device.

33. The method recited in claim 32, further comprising preventing the production of said overcurrent signal for a prescribed time, thereby preventing false production of said overcurrent signal in response to spurious signals at said power transistor device.

34. The method recited in claim 32, further comprising amplifying said control signal to develop said secondary drive signal, and wherein said step of disabling said secondary drive signal comprises disabling an amplifier performing said amplifying step.

35. The method recited in claim 34, further comprising maintaining an input to said amplifier at a substantially constant voltage in the absence of an overcurrent condition in said power transistor device.

36. The method recited in claim 35, further comprising driving an input of said amplifier toward a supply voltage level in the absence of an overcurrent condition in said power transistor device, thereby increasing the speed at which an overcurrent condition is reduced.

37. The method recited in claim 30, wherein said step of driving comprises power transistor device comprising one of a FET, MOSFET, current sensing FET or IGBT.

38. The method recited in claim 30, further comprising coupling two of said circuits to respective power transistor devices, with the power transistor devices coupled in series with a load device.

* * * * *